(12) United States Patent
Boyle et al.

(10) Patent No.: US 7,972,703 B2
(45) Date of Patent: Jul. 5, 2011

(54) BAFFLE WAFERS AND RANDOMLY ORIENTED POLYCRYSTALLINE SILICON USED THEREFOR

(75) Inventors: James E. Boyle, Saratoga, CA (US);
Reese Reynolds, Los Gatos, CA (US);
Ranaan Y. Zehavi, Sunnyvale, CA (US);
Robert W. Mytton, Salem, OR (US);
Tom L. Cadwell, Los Altos, CA (US)

(73) Assignee: Ferrotec (USA) Corporation, Bedford, NH (US)

( * ) Notice: Subject to any disclaimer, the term of this patent is extended or adjusted under 35 U.S.C. 154(b) by 596 days.

(21) Appl. No.: 11/328,438

(22) Filed: Jan. 9, 2006

(65) Prior Publication Data

US 2006/0211218 A1 Sep. 21, 2006

Related U.S. Application Data

(60) Provisional application No. 60/658,075, filed on Mar. 3, 2005, provisional application No. 60/694,334, filed on Jun. 27, 2005.

(51) Int. Cl.
*B32B 9/04* (2006.01)
*B32B 13/04* (2006.01)
*B32B 27/32* (2006.01)
(52) U.S. Cl. .................................. 428/446; 428/220
(58) Field of Classification Search .................... 117/13; 428/220, 446
See application file for complete search history.

(56) References Cited

U.S. PATENT DOCUMENTS

| | | | |
|---|---|---|---|
| 3,494,745 A | 2/1970 | Herczog et al. | |
| 4,040,849 A * | 8/1977 | Greskovich et al. | 423/348 |
| 5,786,027 A | 7/1998 | Rolfson | |
| 5,865,896 A | 2/1999 | Nowak et al. | |
| 6,084,175 A * | 7/2000 | Perry et al. | 136/256 |
| 6,306,764 B1 * | 10/2001 | Kato et al. | 438/660 |
| 6,455,395 B1 | 9/2002 | Boyle et al. | 438/455 |
| 2002/0170486 A1 | 11/2002 | Zehavi et al. | 117/84 |
| 2003/0003686 A1 | 1/2003 | Boyle et al. | |
| 2003/0045131 A1 | 3/2003 | Verbeke et al. | |
| 2003/0119248 A1 * | 6/2003 | Mistry et al. | 438/217 |

(Continued)

FOREIGN PATENT DOCUMENTS

JP 10-144580 5/1998

(Continued)

OTHER PUBLICATIONS

Wolf et al., "Silicon Processing for the VLSI Era: vol. 1—Process Technology", 2d. Ed., Lattice Press, 2000, pp. 5-8.

(Continued)

*Primary Examiner* — Jennifer C McNeil
*Assistant Examiner* — Jonathan C Langman
(74) *Attorney, Agent, or Firm* — Mesmer & Deleault, PLLC

(57) ABSTRACT

Baffle wafers of polycrystalline silicon are placed in non-production slots of a support tower for thermal processing monocrystalline silicon wafers. The polycrystalline silicon is preferably randomly oriented Czochralski polysilicon grown using a randomly oriented seed, for example, CVD grown silicon. An all-silicon hot zone of a thermal furnace may include a silicon support tower placed within a silicon liner and supporting the polysilicon baffle wafers with silicon injector tube providing processing gas within the liner. The randomly oriented polysilicon may be used for other parts requiring a rugged member, for example, within a silicon processing chamber and for structural members.

29 Claims, 5 Drawing Sheets

U.S. PATENT DOCUMENTS

| | | |
|---|---|---|
| 2003/0150378 A1 | 8/2003 | Winterton et al. |
| 2003/0221611 A1 | 12/2003 | Kondo et al. |
| 2005/0003240 A1 | 1/2005 | O'Donnell |
| 2006/0185589 A1 | 8/2006 | Zehavi et al. |

FOREIGN PATENT DOCUMENTS

| | | | |
|---|---|---|---|
| KR | 2002-026670 | * | 4/2002 |

OTHER PUBLICATIONS

Wolf et al., "*Silicon Processing for the VLSI Era*: vol. 1—*Process Technology*", 2d. Ed., Lattice Press, 2000, pp. 9-21.
Wolf et al., "*Silicon Processing for the VLSI Era*: vol. 1—*Process Technology*", 2d. Ed., Lattice Press, 2000, pp. 22-31.
International Search Report; PCT/ US 06/ 05715, Nov. 13, 2007.
International Search Report; PCT/ US2007/025844, Apr. 2, 2008.

* cited by examiner

BAFFLE WAFERS AND RANDOMLY ORIENTED POLYCRYSTALLINE SILICON USED THEREFOR

RELATED APPLICATION

This application claims benefit of provisional application 60/658,075 filed Mar. 3, 2005 and provisional application 60/694,334 filed Jun. 27, 2005.

FIELD OF THE INVENTION

The invention relates generally to thermal processing of silicon wafers. In particular, it relates to non-production wafers used in batch thermal processing of production wafers. The invention also relates to a form of polycrystalline silicon useful for such non-production wafers as well as for other uses.

BACKGROUND ART

Batch thermal processing continues to be used for several stages of fabrication of silicon integrated circuits. One low temperature thermal process deposits a layer of silicon nitride by chemical vapor deposition, typically using chlorosilane and ammonia as the precursor gases at temperatures in the range of about 700° C. Other, high-temperature processes include oxidation, annealing, silicidation, and other processes typically using higher temperatures, for example above 1000° C. or even 1350° C.

For large-scale commercial production, vertical furnaces and vertically arranged wafer towers supporting a large number of wafers in the furnace are typically used, often in a configuration illustrated in the schematic cross-sectional view of FIG. 1. A furnace 10 includes a thermally insulating heater canister 12 supporting a resistive heating coil 14 powered by an unillustrated electrical power supply. A bell jar 16, typically composed of quartz, includes a roof and fits within the heating coil 14. An open-ended liner 18 fits within the bell jar 16. A support tower 20 sits on a pedestal 22 and during processing the pedestal 22 and support tower 20 are generally surrounded by the liner 18. It includes vertically arranged slots for holding multiple horizontally disposed wafers to be thermally processed in batch mode. A gas injector 24 is principally disposed between the liner 18 has an outlet on its upper end for injecting processing gas within the liner 18. An unillustrated vacuum pump removes the processing gas through the bottom of the bell jar 16. The heater canister 12, bell jar 16, and liner 18 may be raised vertically to allow wafers to be transferred to and from the tower 20, although in some configurations these elements remain stationary while an elevator raises and lowers the pedestal 22 and loaded tower 20 into and out of the bottom of furnace 10.

The bell jar 18, which is closed on its upper end, tends to cause the furnace 10 to have a generally uniformly hot temperature in the middle and upper portions of the furnace. This is referred to as the hot zone in which the temperature is controlled for the optimized thermal process. However, the open bottom end of the bell jar 18 and the mechanical support of the pedestal 22 causes the lower end of the furnace to have a lower temperature, often low enough that the thermal process such as chemical vapor deposition is not effective. The hot zone may exclude some of the lower slots of the tower 20.

Conventionally in low-temperature applications, the tower, liner, and injectors have been composed of quartz or fused silica. However, quartz towers and injectors are being supplanted by silicon towers and injectors. One configuration of a silicon tower available from Integrated Materials, Inc. of Sunnyvale, California is illustrated in the orthographic view of FIG. 2. It includes silicon bases. 30, 32 bonded to three or four silicon legs 34 having slots formed therein to support multiple wafers 38. The shape and length of the fingers between the slots varies with the application and process temperature. The fabrication of such a tower is described by Boyle et al. in U.S. Pat. No. 6,455,395. Silicon injectors are also available from Integrated Materials, as disclosed by. Zehavi et al. in U.S. patent application Ser no. 11/177,808, filed July 8, 2005. Silicon liners have been proposed by Boyle et al. in U.S. patent application Ser No. 09/860,392, filed May 18, 2001 and published as U.S. Patent Application Publication 2002/170486

The height of the tower can be modified according to the height of the furnace and may include slots for over 100 wafers. Such a large number of wafers has prompted the use of thermal buffer wafers and dummy wafers to assure that the production wafers are subjected to a uniform thermal environment. Both the top and the bottom of the stack of wafers in the tower during thermal process are subject to thermal end effects. Particularly, the bottom wafers are heated to a significantly lower temperature and the temperature may be low enough that the nitride CVD process or other thermal process is inactive. Accordingly, thermal buffer wafers rather than the substantially monocrystalline silicon production wafers are placed in the topmost and bottommost slots to thermally buffer the ends of the stack and provide a more uniform temperature distribution for the production wafers placed in between. The thermal buffer wafers also act to scavenge impurities from the furnace ambient that tend to be more populous in the top and bottom of the furnace. It is not uncommon to use up to six or twelve thermal buffer wafers on each end. The buffer wafers may be reused for multiple cycles, but current baffle wafers are typically limited to no more than four or five cycles.

Silicon production wafers are often processed in batches of about 25 wafers, corresponding to the capacity of carrying cassettes transporting them between fabrication tools. The large number of wafer slots allows multiple batches to be simultaneously processed. However, there are situations when less than the maximum number of batches need thermal processing. In these situations it is common to nonetheless fully populate the tower by inserting dummy wafers in the empty slots.

Thermal buffer wafers and dummy wafers will be jointly referred to as baffle wafers.

In the past in conjunction with quartz towers, the baffle wafers were typically composed of quartz (fused silica), which are inexpensive and have the further advantage of being opaque to infrared radiation to thereby reduce the end effects of radiation greater than 4.5 µm (the quartz window) bathing the tower. However, just like quartz towers, quartz buffer and dummy wafers have been recognized to contribute to the generation of particles to a degree unsatisfactory for the fabrication of advanced devices. The use of production type of monocrystalline silicon wafers as baffle wafers have not been completely successful. They have been observed to fracture easily in repeated use. Further in nitride deposition process, the silicon nitride is deposited on the baffle wafers to greater thicknesses in multiple uses and has been observed flake off, again creating a particle problems. As a result, in advanced production monocrystalline silicon baffle wafers are limited to a lifetime of only a few cycles before they are discarded or refurbished.

Silicon carbide baffle wafers have also been used, particularly at higher temperatures. However, silicon carbide wafers are expensive and are also subject to effects arising from the differential coefficient of thermal expansion between a silicon carbide wafer and a silicon tower.

Accordingly, less expensive baffle wafers are desired which nonetheless provide superior performance including ruggedness and ability to have great thickness of nitride and other material deposited thereon without flaking.

SUMMARY OF THE INVENTION

One aspect of the invention of the invention includes randomly oriented polycrystalline silicon (ROPSi), for example, grown by the Czochralski (CZ) method by drawing a seed from a silicon melt. The seed may be itself randomly oriented polycrystalline silicon. It may be cut from a rod of virgin polysilicon, also known as electronic grade silicon, grown by chemical vapor deposition (CVD) from precursors of silane-type materials. Alternatively, the seed may be cut from a CZ-grown ingot using a seed cut from an ingot grown by a CVD-traceable seed. In the latter case, at least a distant generation of the seed originated from virgin polysilicon or from a seed traceable to such a CVD-grown seed.

Another aspect of the invention includes polycrystalline buffer and dummy wafers, collectively baffle wafers. More preferably the polycrystalline wafers are cut from ingots grown from a randomly oriented polycrystalline silicon seed, for example, a CVD-traceable seed.

In typical use, baffle wafers of the invention are placed together with monocrystalline silicon production wafers on a tower and are simultaneously processed in a furnace or other thermal processing apparatus.

The baffle wafer may be prepared in a multi-step process. After being cut from the ingot, the wafer may be etched, for example, in an alkaline solution to reduce or eliminate strain. The wafer, preferably after strain etching, is subject to surface treatment producing sub-surface damage on its two principal surfaces and perhaps on its peripheral edge. The sub-surface damage may be performed by bead blasting or by grinding or machining. The surface-damaged wafer is then subjected to an acidic cleaning step and then to ultrasonic cleaning.

CZ grown or randomly oriented polysilicon is also useful for forming machined structures because of its purity, fine polycrystalline structure, and ruggedness.

DETAILED DESCRIPTION OF THE PREFERRED EMBODIMENTS

We believe that commercial grade silicon production wafers are inappropriate for use as buffer and dummy wafers, collectively referred to as baffle wafers, because they are monocrystalline. It is understood that production wafers often are not perfectly monocrystalline and may have several defects including dislocations and slips. However, the defects must be minimal for reasonable yield in production and the typical goal is to obtain and maintain low-dislocation and slip-free monocrystalline production wafers.

If the edge of the monocrystalline wafer is chipped under repeated usage as a baffle wafer, the crack is likely to propagate across the wafer along crystalline cleavage planes and cause it to break. Commercial grade monocrystalline wafers are further inappropriate for baffle wafers because they are expensive. Although older wafers were surface treated on their back side while their front surfaces were polished, very advanced production has required polishing on both the front and back surfaces of production wafers. Monocrystalline wafers are also disadvantageous for multiple use as buffer and thermal wafers because of their tendency to warp into the shape of potato chips or other bowed shapes after extensive high-temperature processing. Semi-single crystalline baffle wafers have been used in the past, but they suffer from many of the disadvantages of monocrystalline baffle wafers, for example, fracturing along favored crystal planes.

Figure 1:
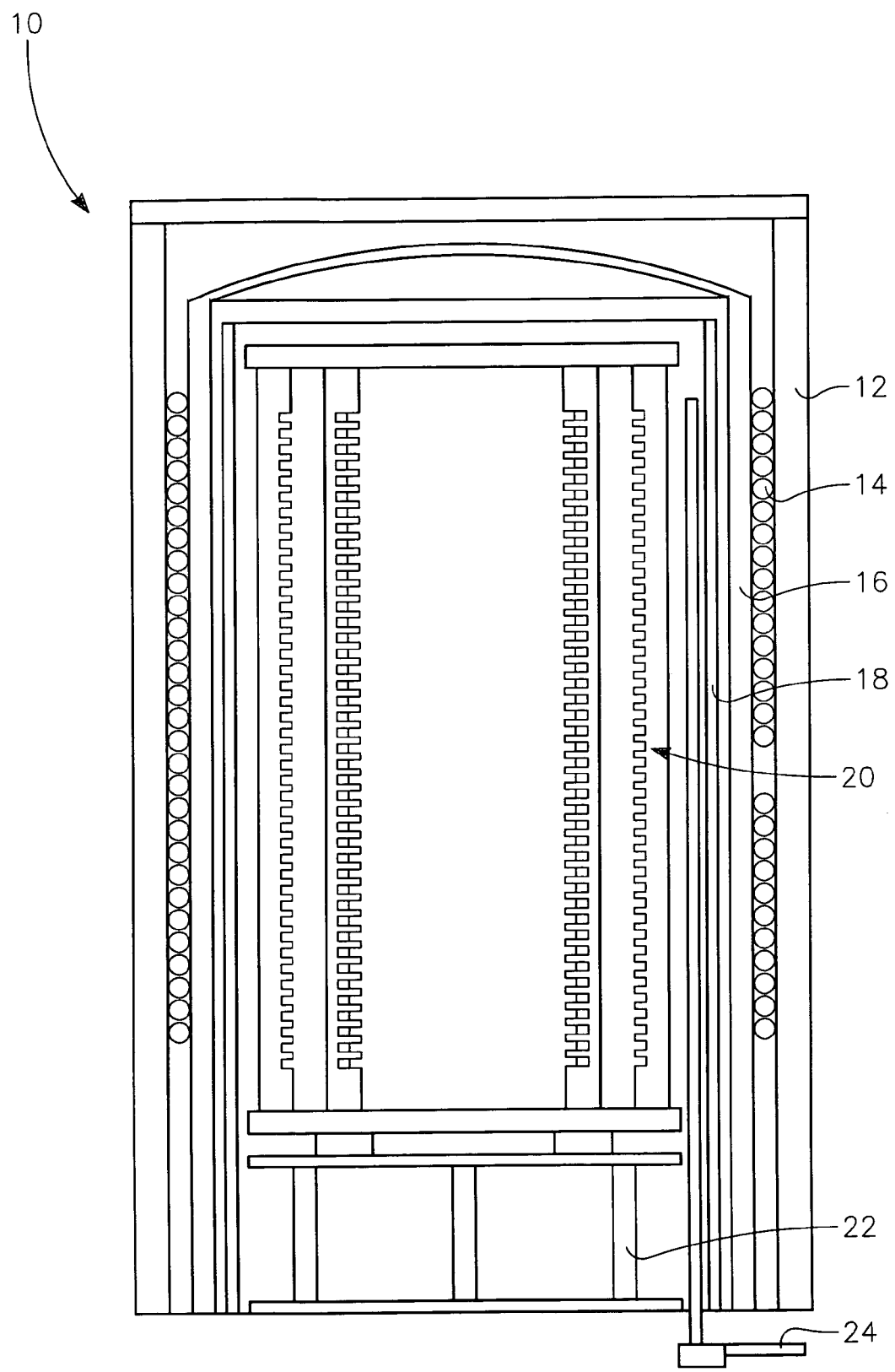
FIG. 1 is a schematic cross-sectional view of a typical thermal processing furnace.
Figure 2:
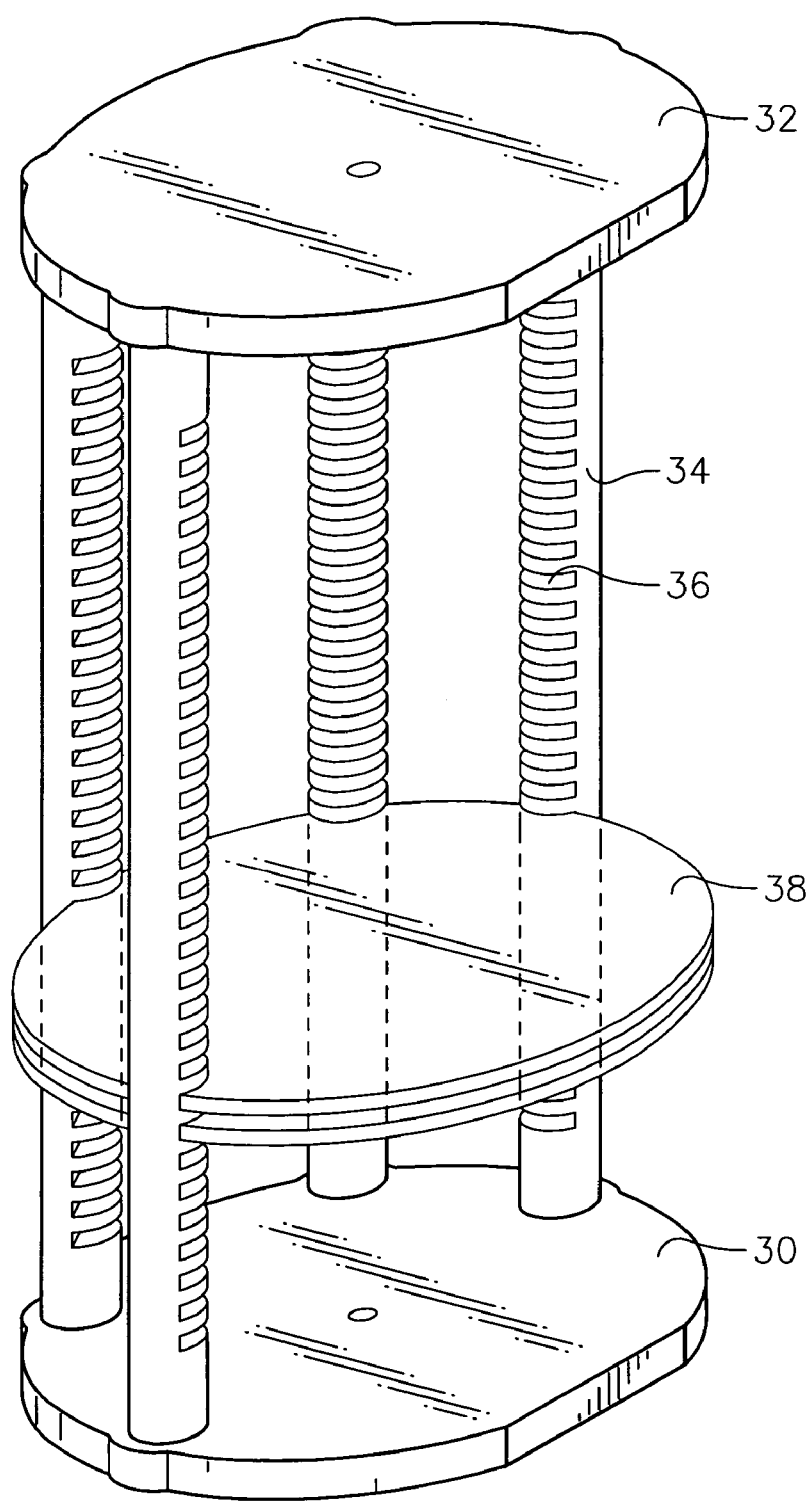
FIG. 2 is an orthographic view of a silicon tower advantageously used with the invention.
Figure 3:
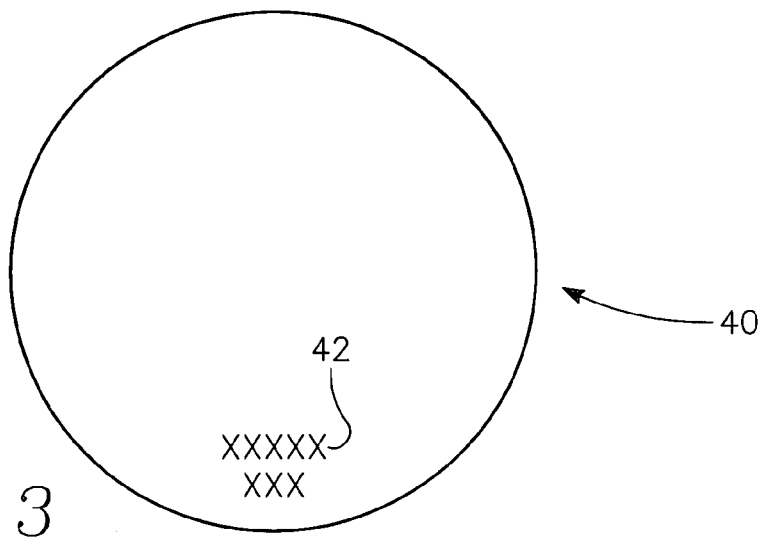
FIG. 3 is a plan view of a polysilicon baffle wafer of the invention.

Instead of monocrystalline production wafers, it is preferred that the baffle wafers be formed of polycrystalline silicon. A polysilicon baffle wafer 40 illustrated in plan view in FIG. 3 has a shape closely following that of a monocrystalline silicon production wafer but it has a visible random grain structure rather than the featureless surface of a monocrystalline wafer. The diameter of the baffle wafer should fall within industry standards for production wafers, that is, about 200 or 300 mm for most current wafer production, but it may be somewhat thicker and does not require standard wafer features such as bevels. Visible indicia 42, such as product number and serial number, may be formed on a principal surface. It is also preferred that both sides of the baffle wafers be surface treated to provide a more adherent base for the thicker layers deposited in multiple cycles.

Figure 4:
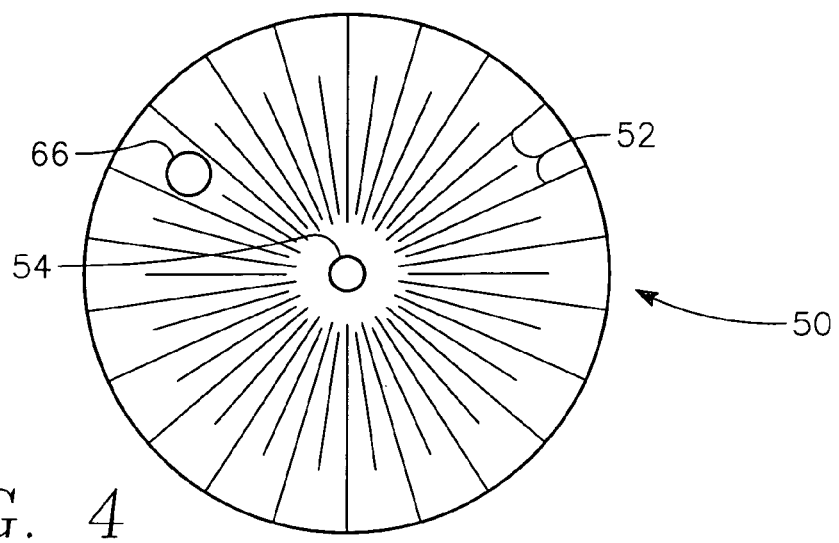
FIG. 4 is a cross-sectional view of a virgin polysilicon ingot.

Virgin polysilicon, also known as electronic grade silicon (EGS), is the source material for most Czochralski (CZ) grown silicon used for production wafers. Virgin polysilicon has been recently used for fabricating wafer towers and other structures, as described in the above two patent documents to Boyle et al. Virgin polysilicon is grown by the chemical vapor deposition of silane or halosilane at about 600° C. or above in the presence of hydrogen upon a hot seed rod of silicon. Other silanes such as disilane could be substituted. See Wolf et al., Silicon Processing for the VLSI Era: Volume 1—Process Technology, 2d. ed., Lattice Press, 2000, pp. 5-8. Virgin poly grown from $SiH_4$ has possible advantages because of its purity, but virgin poly grown from $SiCl_3H$ or other halosilanes is more economic. As grown, a virgin polysilicon ingot 50 has a cross-sectional structure illustrated in FIG. 4. Crystalline dendrites 52 extend outwardly from a seed rod 54. Virgin polysilicon is typically grown with high internal stresses, which normally prevent the material from being machined. However, as explained by Boyle et al., if the virgin polysilicon is annealed, it may be machined since the annealing removes the stress. Virgin poly grown from pure silane ($SiH_4$) usually has smaller crystallites than that grown from trichlorosilanes.

According to one aspect of the invention, polycrystalline silicon ingots can also be grown (drawn or pulled from the silicon melt) by the Czochralski (CZ) method described by Wolf et al., ibid. at pp. 8-21 for monocrystalline ingots. Polycrystalline CZ silicon in large sizes is available from a small number of companies. Such silicon contains many crystallites but the exposed face is typically composed of crystallites which are <100>-oriented within ±20° of the surface normal although other favored orientations such as <111> or <110> can be obtained under the proper conditions. Such semi-single material can be surface treated. It is less prone to crack propagation than monocrystalline silicon, but cracks can nonetheless propagate because of the preferred orientation. Polycrystalline silicon cast in quartz molds is also available, but its purity level is inferior to that obtained from CZ-grown polysilicon.

In general, according to one aspect of the invention, polycrystalline CZ silicon may be obtained by using a polycrystalline silicon seed, preferably randomly oriented polycrystalline silicon (ROPSi), rather than the typical monocrystalline seed or the occasionally previously used polycrystalline seed derived from semi-single silicon. A standard Czochralski crystal growing furnace may be used but a conically shaped heat shield should be included which extends to within 40 mm of the melt surface. Chamber pressure of backfilled argon may be maintained in the range of 10 to 50 Torr. After the virgin polysilicon charge has melted and the temperature has stabilized, the seed is dipped into the melt surface and maintained there until the seed/melt interface has formed a smooth meniscus. The seed is then pulled at a rate sufficient that no neck forms which is less than the seed diameter. A simple conical expansion region joining the seed to a 200 mm or 300 mm ingot may extend over 10 to 20 cm. The pull rate is then adjusted to maintain the desired ingot diameter. The polysilicon CZ ingot may be pulled faster than a monocrystalline CZ ingot. Only minimal tail end taper is needed at the end of the pulling. The pulled ingot should be slowly cooled at ambient.

Figure 5:
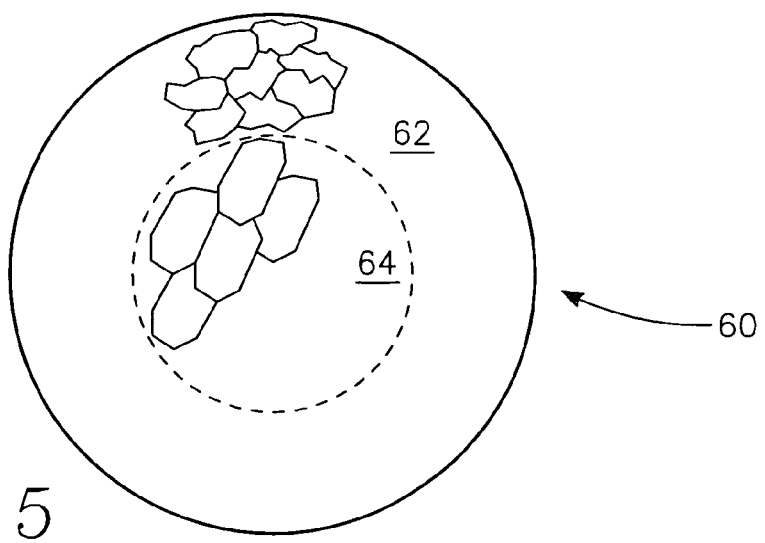
FIG. 5 is a cross-sectional view of a Czochralski polysilicon ingot grown from a virgin polysilicon seed as well as a plan view of a baffle wafer cut therefrom.

A polycrystalline CZ ingot 60 illustrated in the cross-sectional view of FIG. 5 grown from a polycrystalline seed of virgin poly produced from either $SiH_4$ or $SiCl_3H$ precursor gas has been observed to produce an outer zone 62 of crystallites of somewhat irregular shapes and an inner zone 64 of somewhat larger crystallites of more symmetric shape sized typically less than 1 cm. The figure does not accurately illustrate the size of the crystallites. In some runs, the crystallites of 3 to 10 mm were randomly distributed across the wafer. Generally, growth conditions may be varied to control the distribution with a desirable distribution in the range of 1 to 10 mm One embodiment of inventive CZ polycrystalline growth uses a seed rod 66, illustrated in FIG. 4, cut from the outer region of the virgin poly ingot 50 along the axis of the ingot 50 after the ingot 50 has been annealed to allow its machining. Such a virgin poly seed used in CZ growth produces an ingot 60 illustrated in the cross-sectional view of FIG. 5. The material of such a CZ ingot 60 can be characterized as CVD-source silicon because its crystal structure is traceable to the CVD-produced virgin poly.

Ingots 60 have been grown by Kayex of Rochester, New York under the direction of the present inventors using silicon seed rods having a diameter of about 1 cm and a length of about 20 cm. Seeds of both virgin polysilicon materials formed by either $SiH_4$ and $SiHCl_3$ CVD precursor gas have produced substantially similar CZ results.

The crystallography of slices or wafers of such material has been established by Laue X-ray experiments. The polysilicon has been determined to exhibit substantially random orientation of its crystallites with no preferred normal orientation relative to the ingot axis or any other axis.

Figure 6:
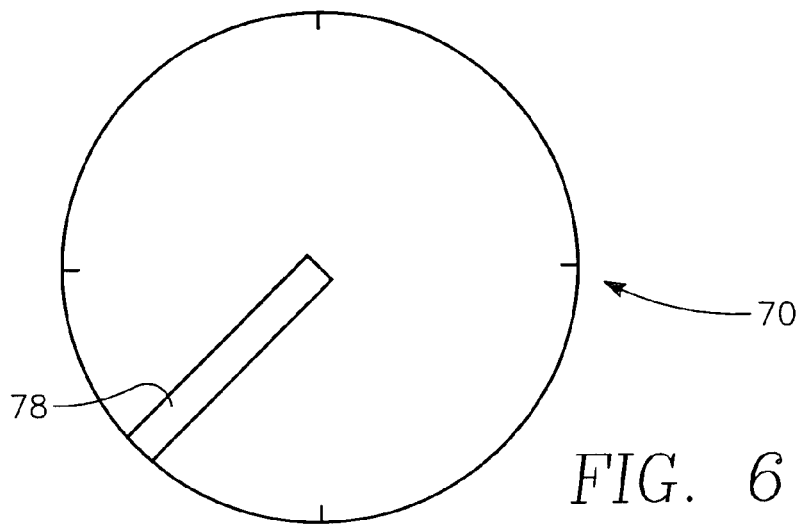
FIG. 6 is a cross-sectional view of a CVD-source Czochralski polysilicon ingot as well as a plan view of a baffle wafer cut therefrom.

It is possible use a polycrystalline CZ ingot 70, illustrated in the cross-sectional view of FIG. 6, (which may be the ingot 60 of FIG. 6) as a source for further seeds, for example by cutting a radial plug 78 from the ingot 70 or a thick slice thereof and using that plug as the seed for another generation of polycrystalline CVD-source silicon. In particular, the end of the plug 78 nearer the outer edge of the ingot may have a smaller crystallite size and is the preferred portion of the seed to contact the silicon melt. If necessary to obtain a seed rod of sufficient length, a shorter ROPSi seed may be welded or otherwise bonded to a longer silicon rod since most of the seed rod assembly never dips into the melt and the longer rod can be reused. Further generations of CVD-source CZ ingots can be grown by using a seed developed from the previous generation. CVD-source seeds includes the original generation of virgin poly grown from any types of silane-containing precursor material including without limitation $SiH_4$, $SiClH_3$, $SiCl_2H_2$, $SiCl_3H$, and $SiCl_4$ as well as other halosilanes and multi-silanes and further generations of seeds cut from CZ polycrystalline silicon having a seed traceable to the virgin poly seed.

Other types of polycrystalline silicon especially randomly oriented polycrystalline silicon may be used with the invention.

The fabrication of the buffer and dummy wafers from the polycrystalline ingot follows in part the process used to fabricate monocrystalline production wafers from a monocrystalline ingot. The ingot needs to have diameter somewhat larger than the wafer. Advanced commercial production is gradually moving from 200 mm to 300 mm although standard wafer sizes continue at 75 mm, 100 mm, 125 mm, and 150 mm. The next generation of wafers is expected to have diameters of 450 mm.

Figure 7:
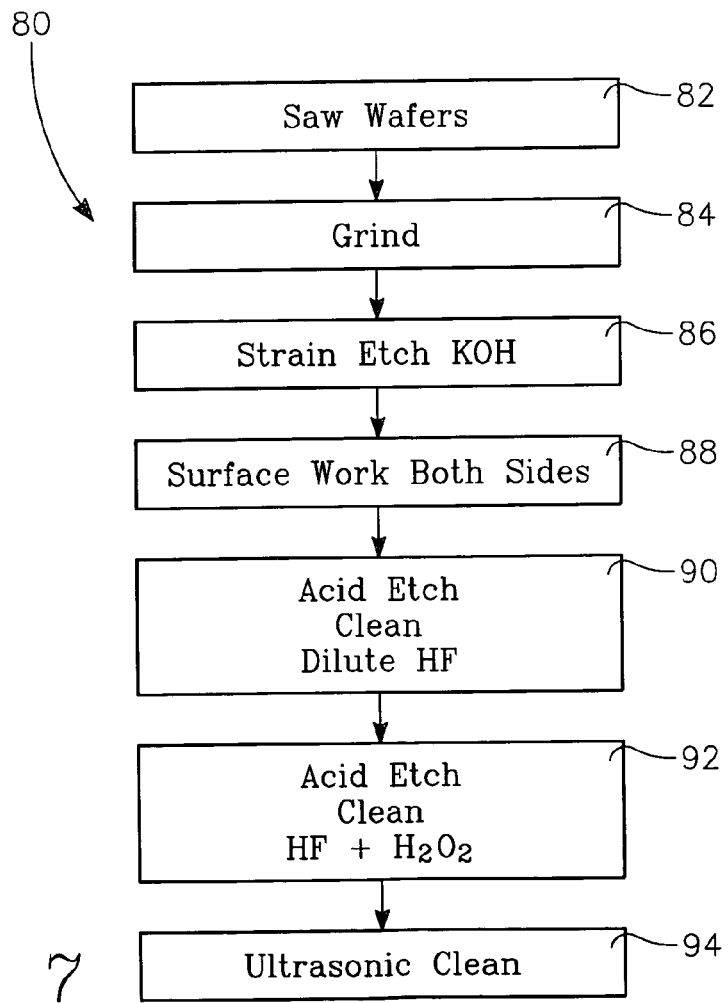
FIG. 7 is one embodiment of a process sequence for processing polycrystalline silicon baffle wafers.

The polycrystalline wafers may be formed in a process 80 illustrated generally in the flow diagram of FIG. 7, which combines and adapts the standard production wafer processing described by Wolf et al., ibid. pp. 22-31 and the process used to form virgin poly towers as described in the two references to Boyle et al. Some of the steps may be omitted depending upon performance requirements and fabrication results. The CZ polysilicon is easily machined without further anneal, presumably because the CZ pulling from the melt effectively anneals the polysilicon. The polycrystalline ingot is rounded to the desired diameter, that is, the diameter of the production wafers. In step 82, polycrystalline wafers are cut from the ingot with a wire saw or internal or external circular saw. Their edges are preferably shaped similarly to production wafers. Production wafers typically have thicknesses of 0.725 mm for 200 mm wafers or 0.775 mm for 300 mm wafers. It is desirable to make the buffer and dummy wafers as rugged as possible so thicker baffle waffles have advantages. Accordingly, initial batches of baffle wafers have been prepared with thicknesses of 1.0 to 1.5 mm. Most production equipment can accommodate these slightly thicker wafers. It is expected though that baffle waffles of thickness substantially equal to that of production wafers will prove satisfactory in commercial use.

In step 84, both sides of the polysilicon wafer are flat ground with a Blanchard grinder using a diamond grit in a process similar to lapping. The grinding introduces sub-surface work damage including cracks and crevices to a depth of 25 to 50 μm. Such features provide anchors for thick films deposited on baffle wafer after many cycles of production, thereby reducing flaking and resultant particulates. A caustic or alkaline strain-reducing etch 86 is performed by immersing the polycrystalline wafers in dilute potassium hydroxide (KOH). The strain etch 86 relieves strain and generally cleans the wafers. However an alternative process simply ultrasonically cleans the wafer in a bath of deioinized (DI) water. A surface treatment step 88 is performed upon both principal surfaces of the wafer to remove visible surface features of sawing and grinding and leave a uniformly gray surface. The surface treatment may include Blanchard grinding or machining which produces desirable sub-surface work damage. If such surface work is not required bead blasting using silicon carbide powder may be used to remove visible surface features of sawing and grinding. A first acid cleaning step 90 is performed by immersing the polycrystalline wafers in dilute hydrofluoric acid (HF). The first acid cleaning step 90 is effective at removing any silicon oxide on the wafer surface. A second acid cleaning step 92 is performed by immersing the wafers in a mixture of water, HF, and hydrogen peroxide ($H_2O_2$). The second acid cleaning step 92 is effective at removing heavy metals from near the surface of the wafer. Other acid etchants or other types of cleaning agents may be substituted, for example, those well developed for cleaning commercial silicon wafers or others used in the chemical analysis of wafers and equipment. An ultrasonic cleaning step 94 is performed by immersing the wafers in a bath of deionized (DI) water and ultrasonically exciting the DI water to thereby clean particles from the surface of the wafers. Note that the illustrated process does not include the polishing performed on production wafers. If desired, a product number and serial number and other identifying indicia may be etched into a principal face of the baffle wafers to facilitate inventory and use. Also, the baffle wafers may be pre-coated on both sides with a layer of the CVD-deposited material with which the baffle wafer will be used, for example, silicon nitride, which is strongly anchored in the cracks and crevices. The polycrystalline wafers are then ready for use by the fab lines. Depending on their practices, it may be recommended that the baffle wafers be pre-coated before use.

Such polycrystalline baffle wafers have lifetimes much longer than monocrystalline ones. Their purity level is much higher and their particle production much lower than the conventional quartz baffle wafers. If the deposition accumulates to an excessive thickness on the polycrystalline baffle wafer, they wafers may be refurbished, for example by removing a portion of the accumulated thickness or by removing it all and redoing some of the wafer fabrication steps of FIG. 7.

It may be desired to continue to use some quartz wafers for thermal buffering, particularly at the bottom portion of the tower which is out of the hot zone. The quartz buffer wafers provide the desired opaqueness to infrared radiation. However, polycrystalline wafers are preferably used throughout the hot zone of the furnace in which deposition is occurring. As a result, the entire hot zone may be filled with silicon, including the tower, the liner, the injectors, the production wafers, and the buffer and dummy wafers. No other materials are present in significant amount in the hot zone to create problems of contamination or thermal expansions.

However, it possible to modify polycrystalline wafers to provide the required infrared opaqueness especially of the buffer wafers. The ROPSi material from which the dummy wafers 10 are formed may be grown with sufficient semiconductor doping to decrease the resistivity to below 1 ohm-cm and preferably below 0.1 ohm-cm or even lower at which the silicon wafer is substantially opaque to the infrared thermal radiation inside a furnace. See Wolf ibid. for CZ growth of doped silicon. Boron is the preferred dopant and it is conventional to grow CZ silicon with such doping. It is also possible to pre-coat the dummy wafers with a sufficient 15 thickness of silicon nitride (or possibly other material) that provides the necessary absorption in the infrared.

The polycrystalline CZ silicon, particularly the CVD-source CZ silicon, may be applied to uses other than baffle wafers. A smaller crystalline structure facilitates the machining of the silicon. The polycrystalline CZ material advantageously has smaller crystal sizes. One application for polycrystalline CZ silicon is forming the two bases of the tower.

Figure 8:
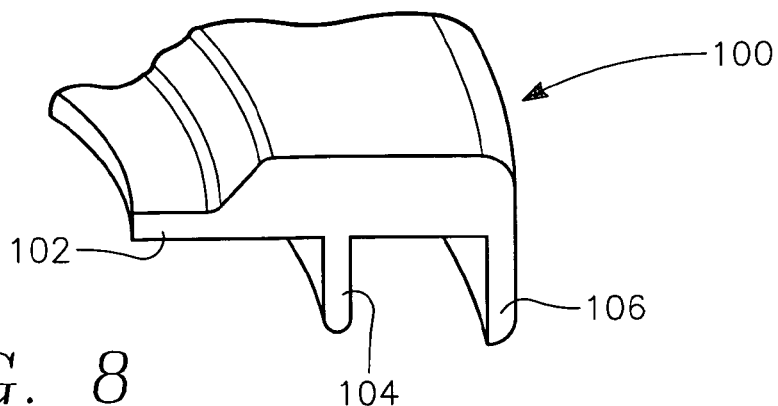
FIG. 8 is a sectioned orthographic view of one type of a wafer ring, in particular, an RTP edge ring.
Figure 9:
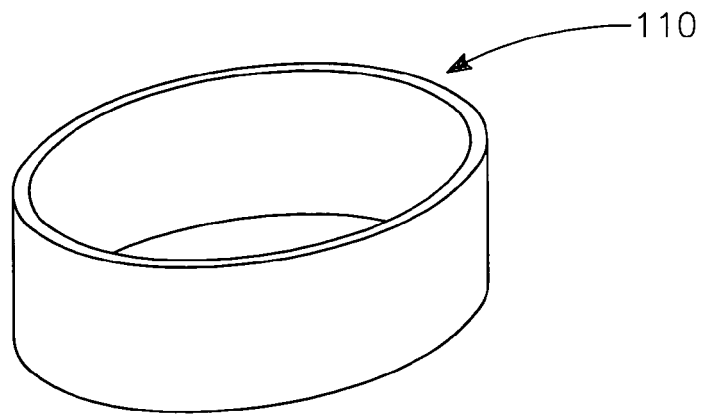
FIG. 9 is an orthographic view of a silicon tube used to support and rotate the edge ring of FIG. 10.

Other possible uses are for edge support rings, such as a ring 100 illustrated in FIG. 8 having a thin inwardly extending annular lip 102 for supporting the periphery of a wafer, in rapid thermal processing (RTP). It is desired to decrease the thickness of the lip 102 to no more than 20 mils (0.5 mm), which is difficult to achieve in polycrystalline silicon other than that of the invention. Two descending annular rims 104, 106 capture a rotary tube 110 illustrated in the orthographic view of FIG. 9 supporting and spinning the edge ring 100 and supported wafer. Less complex structures for edge rings are known. Other similar rings include edge exclusion rings in which the lip or similar overhang overlies and is spaced from the wafer periphery to protect it from deposition and clamp rings which contact the upper wafer periphery to clamp it to a pedestal during processing. The support tube 110 may also be fabricated from the polycrystalline CZ silicon of the invention. The edge rings and support tube composed of silicon used for RTP of silicon production wafers not only provide high purity levels but also simplify the radiation and thermal expansion problems present when these components are made of other material.

Figure 10:
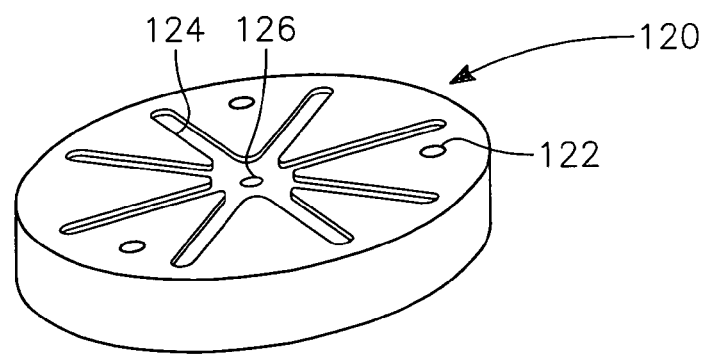
FIG. 10 is an orthographic view of a silicon pedestal platen.

Other applications of the CZ silicon of the invention include pedestal platens, such as platen 120 illustrated in FIG. 10 may be formed of preferably randomly oriented CZ polycrystalline silicon to support a wafer for wafer processing. The generally disk-shaped platen 120 may include axial through holes 122 for lift pins or a branch structure of shallow recesses 124 and a supply hole 126 for a thermal transfer gas. Machining of such fine features is facilitated by the CZ polycrystalline silicon of the invention. Such tower bases, wafer rings, support tubes, and pedestals as well as other chamber parts may require a diameter somewhat greater than the diameter of the wafer being processed. However, poly CZ ingots of sufficient diameters can be pulled in the same CZ pullers used to form the ingots used for the production wafers since the diameter of the monocrystalline CZ ingot is substantially smaller than the diameter of the crucible from which it is being pulled because of the extreme requirements of uniformity imposed on monocrystalline wafers. Such a high degree of uniformity is not required for structural members so larger poly CZ ingots can be grown in the same equipment using a poly seed and adjusting the growth conditions for a larger diameter, for example, by decreasing the pull rate.

Figure 11:
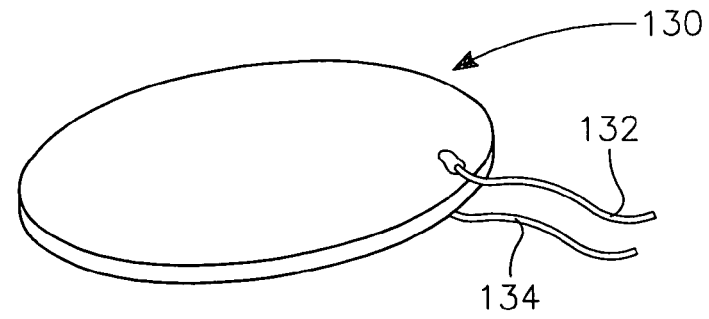
FIG. 11 is an orthographic view of a CZ solar cell.

One use of CZ polycrystalline silicon, particularly poly grown from a virgin polysilicon or CVD-source seed is to form solar cells 130, illustrated in the orthographic view of FIG. 11, in which vertical p-n junctions are formed in slices of silicon, which may be left in their round ingot size or cut into rectangular shape. Electric contacts 132, 134 are made to the front and back of the solar cell 130. The random orientation of CZ crystallites produces a stronger material and thus allows the solar cells to be formed of thinner semiconducting layers of silicon of relatively small crystallite size but of large surface area. Also, the high purity of CZ polycrystalline silicon versus cast silicon provides better semiconductive characteristics since it is believed that the impurities in polycrystalline silicon migrate to the grain boundaries and promote electrical leakage along the boundaries.

Although polysilicon baffle wafers are advantageously used in combination with silicon towers, they have advantages for use in towers and boats of other materials including quartz and silicon carbide.

Silicon wafer boats are another wafer support fixture advantageously used in silicon processing. In a wafer boat, the wafers are arranged in a horizontally extending array in slots within the boat and are oriented with the principal surfaces tilted a few degrees from vertical. As a result, the wafer edge rests on the bottom of the boat and the teeth of the slots contact and support a backside of the wafers. Baffle wafers of the invention may be advantageously used with boats as well as towers.

The randomly oriented polycrystalline silicon of the invention offers many advantages for baffle wafers and well for other rugged members and structures and the material can be grown CZ techniques well developed for commercial monocrystalline wafers.

The invention claimed is:

1. A baffle wafer for use in filling non-production slots of a multi-wafer support fixture configured to support wafers having a first diameter, comprising a wafer comprising a free standing polysilicon member usable by itself as the baffle wafer and consisting essentially of polysilicon of randomly oriented crystallography extending throughout the member, and having the first diameter such that the polysilicon member and silicon production wafers are supportable in the multi-wafer support fixture, wherein polycrystalline silicon extends through the bulk of the member and wherein the polysilicon is Czochralski (CZ) polysilicon and is CVD-source CZ silicon, wherein the polysilicon member comprises an outer zone of crystallites of irregular shapes and an inner zone of larger crystallites of more symmetric shape.

2. The baffle wafer of claim 1, wherein the first diameter is chosen from 75 mm, 150 mm, 200 mm, 300 mm, and 450 mm and wherein the baffle wafer has a thickness in the range of 0.725 mm to 1.5 mm.

3. The baffle wafer of claim 2, wherein the thickness is in the range of 1.0 to 1.5 mm.

4. The baffle wafer of claim 1, having a thickness in a range of 0.725 to 1.5 mm.

5. The baffle wafer of claim 1, which is roughened on both sides.

6. The baffle wafer of claim 1, both sides of which are subjected to sub-surface damage.

7. The baffle wafer of claim 1, wherein the polysilicon member consists of polysilicon.

8. The baffle wafer of claim 1, wherein the polysilicon member consists of silicon.

9. The baffle wafer of claim 1, wherein the polysilicon member structurally consists of a polysilicon body consisting of randomly oriented crystallography.

10. A substrate having an interior portion consisting of randomly oriented polysilicon exclusive of dopants and impurities and grown by the Czochralski (CZ) process with a CVD-source seed, wherein the interior portion comprises an outer zone of crystallites of irregular shapes and an inner zone of larger crystallites of more symmetric shape.

11. The substrate of claim 10 which is circular.

12. The substrate of claim 11 having a diameter chosen from 75 mm, 150 mm, 200 mm, 300 mm, and 450 mm and a thickness in the range of 0.725 mm to 1.5 mm.

13. The substrate of claim 12, wherein the thickness is in the range of 1.0 to 1.5 mm.

14. The substrate of claim 10 consisting of randomly oriented polysilicon.

15. A baffle wafer for use in filling non-production slots of a multi-wafer support fixture, the baffle wafer grown by a method, comprising the steps of:
applying a randomly oriented polycrystalline silicon seed to a silicon melt such that portions of said silicon melt condense on said seed;
drawing the seed and attached condensed silicon melt away from the melt to form an ingot; and
cutting the baffle wafer from the ingot, wherein the baffle wafer comprises an outer zone of crystallites of irregular shapes and an inner zone of larger crystallites of more symmetric shape.

16. The baffle wafer of claim 15, wherein the seed comprises virgin polysilicon.

17. The baffle wafer of claim 15, further comprising growing the seed by chemical vapor deposition.

18. The baffle wafer of claim 15, wherein the randomly oriented polycrystalline silicon seed comprises a CVD-source polycrystalline silicon seed.

19. The baffle wafer of claim 15, wherein the seed is a successor seed and further comprising:
applying a randomly oriented polycrystalline silicon predecessor seed to a silicon melt such that portions of said silicon melt condense on said predecessor seed;
drawing the predecessor seed and attached condensed silicon melt away from the melt to form a second ingot; and
cutting the successor seed from the second ingot.

20. A silicon structural member grown by the method, comprising the steps:
applying a randomly oriented polycrystalline silicon seed to a silicon melt such that portions of the silicon melt condense on the seed;
drawing the seed and attached condensed silicon melt away from the melt to form an ingot; and
cutting the silicon structural member from the ingot, wherein the silicon structural member comprises an outer zone of crystallites of irregular shapes and an inner zone of larger crystallites of more symmetric shape.

21. The structural member of claim 20, wherein the seed comprises virgin polysilicon.

22. The structural member of claim 20, further comprising growing the seed by chemical vapor deposition.

23. The structural member of claim 20, wherein the randomly oriented polycrystalline silicon seed comprises a CVD-source polycrystalline silicon seed.

24. The structural member of claim 20, wherein the seed is a successor seed and further comprising:
applying a randomly oriented polycrystalline silicon predecessor seed to a silicon melt such that portions of said silicon melt condense on said predecessor seed;
drawing the predecessor seed and attached condensed silicon melt away from the melt to form a second ingot; and
cutting the successor seed from the second ingot.

25. The structural member of claim 20, configured as a part of a wafer support tower.

26. A baffle wafer for use in filling non-production slots of a multi-wafer support fixture, the baffle wafer grown by a method, comprising the steps of:
applying a CVD-source polycrystalline silicon seed to a silicon melt such that portions of said silicon melt condense on said seed;
drawing the seed and attached condensed silicon melt away from the melt to form an ingot; and cutting the baffle wafer from the ingot, wherein the baffle wafer comprises an outer zone of crystallites of irregular shapes and an inner zone of larger crystallites of more symmetric shape.

27. The baffle wafer of claim 26, wherein the seed comprises virgin polysilicon.

28. A silicon structural member grown by the method, comprising the steps:

applying a CVD-source polycrystalline silicon seed to a silicon melt such that portions of the silicon melt condense on the seed;

drawing the seed and attached condensed silicon melt away from the melt to form an ingot; and cutting the silicon structural member from the ingot, wherein the silicon structural member comprises an outer zone of crystallites of irregular shapes and an inner zone of larger crystallites of more symmetric shape.

29. The structural member of claim 28, wherein the seed comprises virgin polysilicon.

* * * * *